US006153931A

United States Patent [19]

Niimi et al.

[11] Patent Number: 6,153,931

[45] Date of Patent: Nov. 28, 2000

[54] SEMICONDUCTOR CERAMIC AND ELECTRONIC ELEMENT FABRICATED FROM THE SAME

[75] Inventors: Hideaki Niimi, Hikone; Mitsutoshi Kawamoto, Hirakata; Akinori Nakayama, Otsu; Satoshi Ueno, Omihachiman; Ryouichi Urahara, Yokaichi, all of Japan

[73] Assignee: Murata Manufacturing Co., Ltd., Japan

[21] Appl. No.: 09/262,573

[22] Filed: Mar. 4, 1999

[30] Foreign Application Priority Data

Mar. 5, 1998 [JP] Japan .................................. 10-053626

[51] Int. Cl.$^{7}$ ........................ H01L 31/0256; H01L 23/06; C04B 35/46; C04B 35/48; C04B 35/49

[52] U.S. Cl. .......................... 257/703; 257/613; 501/135; 501/136; 501/137; 501/138

[58] Field of Search .................................... 257/613, 615, 257/703; 501/135–138

[56] References Cited

U.S. PATENT DOCUMENTS

| | | | |
|---|---|---|---|
| 4,335,216 | 6/1982 | Hodgkins et al. | 501/32 |
| 4,540,676 | 9/1985 | Chu et al. | 501/138 |
| 5,296,426 | 3/1994 | Burn | 501/139 |

*Primary Examiner*—David Hardy
*Assistant Examiner*—Allan R. Wilson
*Attorney, Agent, or Firm*—Ostrolenk, Faber, Gerb & Soffen, LLP

[57] ABSTRACT

The present invention provides a barium titanate-based semiconducting ceramic which exhibits excellent PTC characteristic and which can be fired at a temperature lower than 1000° C. The present invention also provides an electronic element fabricated from the ceramic. The semiconducting ceramic contains, in a semiconducting sintered barium titanate; boron oxide; an oxide of at least one of barium, strontium, calcium, lead, yttrium and a rare earth element; and an optional oxide of at least one of titanium, tin, zirconium, niobium, tungsten and antimony in which the atomic boron is $$0.005 \leqq B/\beta \leqq 0.50 \text{ and}$$

$$1.0 \leqq B/(\alpha-\beta) \leqq 4.0$$

wherein α represents the total number of atoms of barium, strontium, calcium, lead, yttrium and rare earth element contained in the semiconducting ceramic, and β represents the total number of atoms of titanium, tin, zirconium, niobium, tungsten and antimony contained in the semiconducting ceramic.

16 Claims, 2 Drawing Sheets

SEMICONDUCTOR CERAMIC AND ELECTRONIC ELEMENT FABRICATED FROM THE SAME

BACKGROUND OF THE INVENTION

1. Field of the Invention

The present invention relates to a semiconducting ceramic and an electronic element a fabricated from the ceramic. More particularly, the present invention relates to a semiconducting ceramic having a positive temperature characteristic and an electronic element fabricated from the same.

2. Background Art

Conventionally, semiconducting electronic elements having a positive temperature coefficient of resistance (hereinafter referred to as a PTC characteristic)—meaning that electrical resistance increases drastically when temperature exceeds Curie temperature—have been used to protect a circuit from overcurrent or to demagnetize elements of a color television set. In view of their advantageous PTC characteristic, semiconducting ceramics predominantly comprising barium titanate have generally been used in such semiconducting electronic elements.

However, in order to make barium-titanate based ceramics semiconducting, firing must generally be performed at a temperature of 1300° C. or more. Such treatment at high temperature has the following drawbacks: a tendency to damage the furnace used for firing; high cost of maintaining the furnace; and high energy consumption. Thus, there has been demand for semiconducting ceramics comprising barium titanate which can be fired at a lower temperature.

To overcome the above drawbacks, a modified technique is disclosed in "Semiconducting Barium Titanate Ceramics Prepared by Boron-Conducting Liquid-Phase Sintering" (In-Chyuan Ho, *Communications of the American Ceramic Society,* Vol. 77, No. 3, p829–p832, 1994). Briefly, the temperature at which the ceramics exhibit semiconduction is lowered by addition of boron nitride to the barium titanate. The literature reports that the boron nitride-added ceramics can become semiconducting at a firing temperature of about 1100° C. Although the temperature at which conventional ceramics exhibit semiconduction has decreased, the temperature is still more than 1000° C. and the decrease is still unsatisfactory.

SUMMARY OF THE INVENTION

In view of the foregoing, an object of the present invention is to provide a semiconducting ceramic which comprises barium titanate having an advantageous PTC characteristic and which can be fired at a temperature lower than 1000° C. Another object of the present invention is to provide an electronic element fabricated from the semiconducting ceramic.

Accordingly, in a first aspect of the present invention, there is provided a semiconducting ceramic comprising a semiconducting sintered barium titanate containing the following substances: boron oxide; an oxide of at least one metal selected from barium, strontium, calcium, lead, yttrium and a rare earth element; and an optional oxide of at least one metal selected from among titanium, tin, zirconium, niobium, tungsten and antimony; the boron oxide being incorporated in an amount, reduced to atomic boron, satisfying the following relationships:

$$0.005 \leqq B/\beta \leqq 0.50 \text{ and}$$

$$1.0 \leqq B/(\alpha-\beta) \leqq 4.0$$

wherein α represents the total number of atoms of barium, strontium, calcium, lead, yttrium and rare earth element contained in the semiconducting ceramic, and β represents the total number of atoms of titanium, tin, zirconium, niobium, tungsten and antimony contained in the semiconducting ceramic.

According to the first aspect of the invention, the semiconducting ceramic comprising barium titanate maintains its PTC characteristic and can be fired at a temperature lower than 1000° C.

In a second aspect of the present invention, there is provided an electronic element comprising the semiconducting ceramic according to the first aspect of the invention and an electrode formed on the semiconducting ceramic.

According to the second aspect of the present invention, an electronic element can be fabricated from the semiconducting ceramic by firing at low temperature without deteriorating the PTC characteristic.

BRIEF DESCRIPTION OF THE DRAWINGS

Various other objects, features, and many of the attendant advantages of the present invention will be readily appreciated as the same become better understood with reference to the following detailed description of the preferred embodiments in connection with the accompanying drawings, in which.

BEST MODES FOR CARRYING OUT THE INVENTION

Figure 1:
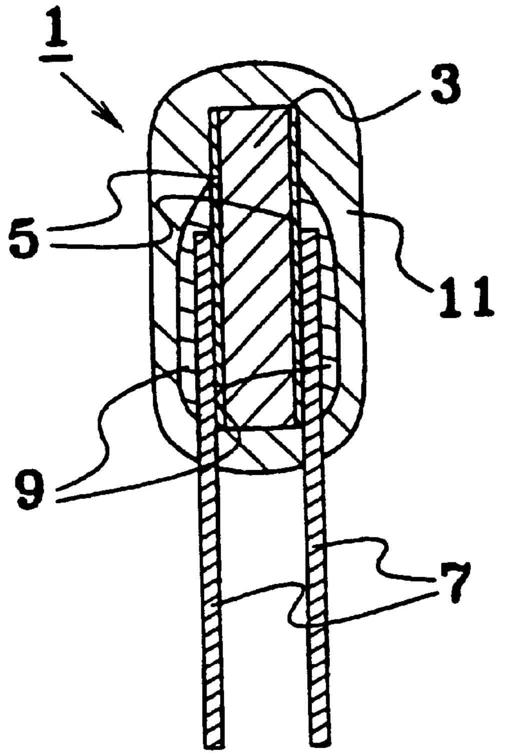
FIG. 1 is a schematic cross-sectional view of an example electronic element fabricated from the semiconducting ceramic according to the present invention.

In the present invention, there may be employed, in addition to $BaTiO_3$, a barium titanate in which the Ba or Ti is partially substituted with another element. For example, the Ba in barium titanate may be partially substituted by Ca, Sr, Pb, Y or a rare earth element (these elements will be referred to as Ba site elements). Similarly, the Ti in barium titanate may be partially substituted by Sn, Zr, etc. (these elements will be referred to as Ti site elements). Although these metal atoms typically exists in the Ti or Ba site of a perovskite $BaTiO_3$ crystal lattice, the metal atoms in excess of the stoichiometric amounts can exist in positions other than these sites. Next, the parameters α and β in the above-described relationships will be described in detail.

α refers to the sum of the total number of atoms which can constitute Ba sites in a semiconducting ceramic and the total number of atoms which form oxides outside the Ba sites in the semiconducting ceramic so as to deviate from the stoichiometric ratio of Ba to Ti. Similarly, β refers to the sum of the total number of atoms which can constitute Ti sites in a semiconducting ceramic and the total number of atoms which form oxides outside the Ti sites in the semiconducting ceramic.

For example, when Ba is partially substituted by Ca, Ti is partially substituted by Sn, and $BaCO_3$ is added to form BaO (after firing) outside the Ba sites, the relationships are as follows:

$$B/\beta=B/(Ti+Sn) \text{ and}$$

$$B/(\alpha-\beta)=B/\{(Ba+Ca)+Ba\}-(Ti+Sn).$$

In the present invention, B/β is limited to the range $0.005\leqq B/\beta\leqq 0.50$. When the ratio falls outside the range, the specific resistivity of the ceramic is high and the ceramic does not become completely semiconducting. B/(α−β) is limited to the range $1.0\leqq B/(\alpha-\beta)\leqq 4.0$. Similarly, when the ratio falls outside the range, the specific resistivity of the ceramic is high and the ceramic does not become completely semiconducting.

No particular limitation is imposed on the ratio of Ba to Ti in the barium titanate used as a starting material in the present invention. Briefly, both Ti-rich barium titanate and Ba-rich barium titanate may be used.

A boron component is incorporated into the semiconducting ceramic according to the present invention, generally in the form of BN or $B_2O_3$. BN is preferred in view of its insolubility in water. During firing, boron remains in the semiconducting ceramic in the form of $B_2O_3$ and nitrogen is released in the atmosphere.

In order to modify the barium content in the semiconducting ceramic according to the present invention, an additional barium component is incorporated thereto, for example, in the form of $BaCO_3$. During firing, Ba in $BaCO_3$ remains in the semiconducting ceramic in the form of BaO and carbon is released in the atmosphere in the form of $CO_2$.

EXAMPLES

The present invention will next be described by way of examples, which should not be construed as limiting the invention thereto.

Example 1

Semiconducting ceramic samples and electronic element samples were prepared as described below.

To hydrothermally synthesized barium titanate (Ba/Ti=0.998) were added $Sm_2O_3$ serving as a source of Sm, which partially substitutes for Ba; BN serving as a source of B; and $BaCO_3$, which forms BaO outside Ba sites of the barium titanate, to thereby provide a mixture of the following composition:

$$(Ba_{0998}TiO_3 \text{ powder, hydrothermally synthesized})+0.001Sm_2O_3+x\,BaCO_3+yBN.$$

The mixture was calcined and crushed, to thereby form a calcined powder, which was then mixed with a binder. The resultant mixture was milled in water for five hours in a ball mill, and then passed through a 50-mesh sieve for granulation to thereby obtain a granulate. The granulate was press-molded to form a compact, which was fired at 950° C. for two hours in air, to thereby obtain a semiconducting ceramic represented by the following formula:

$$Ba_{0.998}Sm_{0.002}TiO_3+xBaO+(½)yB_2O_3.$$

Next, Ni was sputtered on both sides of the semiconducting ceramic piece to thereby fabricate an electronic element from the semiconducting ceramic.

Specific resistivity at room temperature was measured for a plurality of electronic elements fabricated from the semiconducting ceramic pieces which were produced by modifying the ratios B/β and B/(α−β) of the corresponding ceramic. The ratios B/β and B/(α−β) were adjusted by modifying the amount of BaO represented by x and that of $B_2O_3$ represented by y. The results are shown in Table 1. The mark * refers to Comparative Examples in which one or both ratios fall outside the scope of the present invention.

TABLE 1

| Sample No. | B/Ti (B/β) | B/(Ba + Sm − Ti) (B/α − β) | Additives: Amount of elemental Ba (mol) | Additives: Amount of elemental B (mol) | Specific resistivity at room Temperature (Ω · cm) |
|---|---|---|---|---|---|
| *1 | 0.001 | 0.5 | 0.00200 | 0.001 | more than 1,000,000 |
| *2 | 0.001 | 1 | 0.00100 | 0.001 | more than 1,000,000 |
| *3 | 0.001 | 2 | 0.00050 | 0.001 | 52000 |
| *4 | 0.001 | 4 | 0.00025 | 0.001 | 67000 |
| *5 | 0.001 | 6 | 0.00017 | 0.001 | 180000 |
| *6 | 0.005 | 0.5 | 0.0100 | 0.005 | 2400 |
| 7 | 0.005 | 1 | 0.00500 | 0.005 | 960 |
| 8 | 0.005 | 2 | 0.00200 | 0.005 | 590 |
| 9 | 0.005 | 4 | 0.00125 | 0.005 | 950 |
| *10 | 0.005 | 6 | 0.00083 | 0.005 | 2500 |
| *11 | 0.01 | 0.5 | 0.02000 | 0.01 | 1800 |
| 12 | 0.01 | 1 | 0.01000 | 0.01 | 120 |
| 13 | 0.01 | 2 | 0.00500 | 0.01 | 45 |
| 14 | 0.01 | 4 | 0.00250 | 0.01 | 240 |
| *15 | 0.01 | 6 | 0.00167 | 0.01 | 2600 |
| *16 | 0.05 | 0.5 | 0.10000 | 0.05 | 1600 |
| 17 | 0.05 | 1 | 0.05000 | 0.05 | 85 |
| 18 | 0.05 | 2 | 0.02500 | 0.05 | 23 |
| 19 | 0.05 | 4 | 0.01250 | 0.05 | 72 |
| *20 | 0.05 | 6 | 0.00833 | 0.05 | 1700 |

TABLE 1-continued

| Sample No. | B/Ti (B/β) | B/(Ba + Sm − Ti) (B/α − β) | Additives: Amount of elemental Ba (mol) | Additives: Amount of elemental B (mol) | Specific resistivity at room Temperature (Ω · cm) |
|---|---|---|---|---|---|
| *21 | 0.05 | ∞ | 0.00000 | 0.05 | more than 1,000,000 |
| *22 | 0.1 | 0.5 | 0.20000 | 0.1 | 1200 |
| 23 | 0.1 | 1 | 0.10000 | 0.1 | 77 |
| 24 | 0.1 | 2 | 0.05000 | 0.1 | 16 |
| 25 | 0.1 | 4 | 0.02500 | 0.1 | 62 |
| *26 | 0.1 | 6 | 0.01667 | 0.1 | 1100 |
| *27 | 0.5 | 0.5 | 1.0000 | 0.5 | 1600 |
| 28 | 0.5 | 1 | 0.50000 | 0.5 | 260 |
| 29 | 0.5 | 2 | 0.25000 | 0.5 | 120 |
| 30 | 0.5 | 4 | 0.12500 | 0.5 | 350 |
| *31 | 0.5 | 6 | 0.08333 | 0.5 | 2500 |
| *32 | 0.7 | 0.5 | 1.40000 | 0.7 | 230000 |
| *33 | 0.7 | 1 | 0.70000 | 0.7 | 12000 |
| *34 | 0.7 | 2 | 0.35000 | 0.7 | 2900 |
| *35 | 0.7 | 4 | 0.17500 | 0.7 | 9800 |

As shown in Table 1, all electronic elements fabricated from the semiconducting ceramic according to the present invention exhibit a specific resistivity at room temperature of 1000 Ω.cm or less, even when the ceramic was fired at 950° C., thereby confirming that the ceramic became semiconducting. In Sample No. 21, in which no excessive BaO exists outside the Ba sites, the specific resistivity at room temperature is in excess of 1,000,000 Ω.cm, indicating that the ceramic did not become semiconducting.

As is clear from Sample Nos. 1 to 5, when B/β is less than 0.005, the ceramic has a specific resistivity greatly in excess of 1,000 Ω.cm, which is disadvantageous, as the ceramic does not become semiconducting. Also, as is clear from Sample Nos. 32 to 36, when B/β is in excess of 0.50, the ceramic has a specific resistivity in excess of 1,000 Ω.cm, which is disadvantageous, as the ceramic does not become semiconducting.

As is clear from Sample Nos. 1, 6, 11, 16, 22, 27, and 32, when B/(α−β) is less than 1.0, the ceramic has a specific resistivity in excess of 1,000 Ω.cm, which is disadvantageous, as the ceramic does not become semiconducting. Also, as is clear from Sample Nos. 5, 10, 15, 20, 26, 31, and 36, when B/(α−β) is in excess of 4.0, the ceramic has a specific resistivity in excess of 1,000 Ω.cm, which is disadvantageous, as the ceramic does not become semiconducting.

The above results show that samples in which one or both of the two ratios, i.e., B/β and B/(α−β), fall outside of the scope of the present invention provide disadvantageous conductivity.

Example 2

The procedures described in Example 1 were repeated except that the content of $B_2O_3$ represented by y, the species and amount of oxides formed outside the Ba sites, and the species and amount of oxides, e.g., $Sm_2O_3$, BaO, $La_2O_3$, $Nd_2O_3$, $Dy_2O_3$, $Y_2O_3$, CaO, SrO and $Pb_3O_4$, which partially substitute for Ba in the Ba sites were changed. As in Example 1, samples of Example 2 were subjected to measurement of specific resistivity at room temperature. The firing temperature was 950° C. The results are shown in Table 2.

TABLE 2

| Sample No. | Amount of additives other than $BaTiO_3$, based on 1 mol of $Ba_{0.998}TiO_3$ (unit: mol): Contained in α | Contained in β | Amount of elemental B (mol) | B/β | B/(α, β) | Specific resistivity at room temperature (Ω · cm) |
|---|---|---|---|---|---|---|
| 40 | $Sm_2O_3$: 0.001<br>BaO: 0.025 | — | 0.05 | 0.05 | 2 | 23 |
| 41 | $La_2O_3$: 0.001<br>BaO: 0.025 | — | 0.05 | 0.05 | 2 | 25 |
| 42 | $Nd_2O_3$: 0.001<br>BaO: 0.025 | — | 0.05 | 0.05 | 2 | 24 |
| 43 | $Dy_2O_3$: 0.001<br>BaO: 0.025 | — | 0.05 | 0.05 | 2 | 23 |
| 44 | $Y_2O_3$: 0.001<br>BaO: 0.025 | — | 0.05 | 0.05 | 2 | 32 |
| 45 | BaO: 0.02905 | $Sb_2O_3$: 0.001 | 0.0501 | 0.05 | 2 | 25 |
| 46 | BaO: 0.02905 | $Nb_2O_5$: 0.001 | 0.0501 | 0.05 | 2 | 24 |
| 47 | BaO: 0.02905 | $WO_3$: 0.002 | 0.0501 | 0.05 | 2 | 34 |
| 48 | $Sm_2O_3$: 0.001<br>CaO: 0.025 | — | 0.05 | 0.05 | 2 | 45 |

TABLE 2-continued

| Sample No. | Amount of additives other than $BaTiO_3$, based on 1 mol of $Ba_{0.998}TiO_3$ (unit: mol) Contained in α | Contained in β | Amount of elemental B (mol) | B/β | B/(α, β) | Specific resistivity at room temperature (Ω · cm) |
|---|---|---|---|---|---|---|
| 49 | $Sm_2O_3$: 0.001 $SrO$: 0.025 | — | 0.05 | 0.05 | 2 | 28 |
| 50 | $Sm_2O_3$: 0.001 $Pb_3O_4$: 0.025 | — | 0.05 | 0.05 | 2 | 35 |
| 51 | $Sm_2O_3$: 0.001 $BaO$: 0.025 | $SnO_2$: 0.05 | 0.0525 | 0.05 | 2 | 29 |
| 52 | $Sm_2O_3$: 0.001 $BaO$: 0.025 | $ZrO_2$: 0.05 | 0.525 | 0.05 | 2 | |

As shown in Table 2, when the oxides which are formed outside the Ba sites are added in an amount which satisfies the specified ranges provided for B/β and B/(α−β), the specific resistivity at room temperature decreases. As seen from the data of Sample Nos. 45, 46, 47, 51, and 52, specific resistivity at room temperature also decreases through addition of oxides; namely, $Sb_2O_5$, $Nb_2O_5$, $WO_3$, $SnO_2$ and $ZrO_2$, into the Ti sites so long as the content thereof satisfy the specified ranges provided for B/β and B/(α−β).

Next, different types of products which incorporate the semiconducting ceramic element of the present invention will be illustrated.

FIG. 1 shows an example product of an electronic element fabricated from the semiconducting ceramic according to the present invention.

The semiconducting ceramic element 1 shown in FIG. 1 is of a resin-coated type, and comprises a semiconducting ceramic 3, electrodes 5 formed on the semiconducting ceramic 3, lead terminals 7 connected to the electrodes 5, and a resin covering 11.

Figure 2:
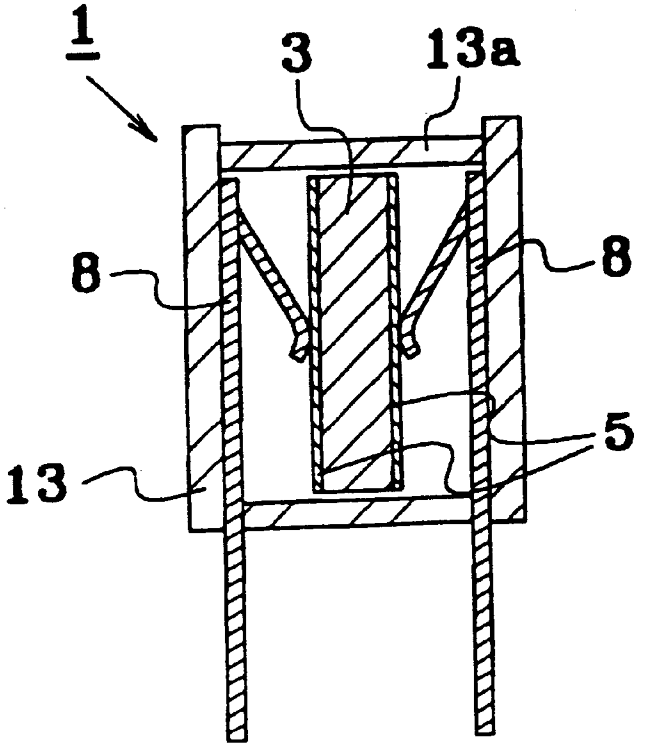
FIG. 2 is a schematic cross-sectional view of another example electronic element fabricated from the semiconducting ceramic according to the present invention.

FIG. 2 shows another example product of an electronic element fabricated from the semiconducting ceramic according to the present invention.

The semiconducting ceramic element 1 shown in FIG. 2 is of a case-housed-type, and comprises a semiconducting ceramic 3, electrodes 5 formed on the semiconducting ceramic 3, spring terminals 8 which are electrically connected with the electrodes 5, a casing body 13 which houses the above elements, and a lid 13*a* for the casing 13 body.

Figure 3:
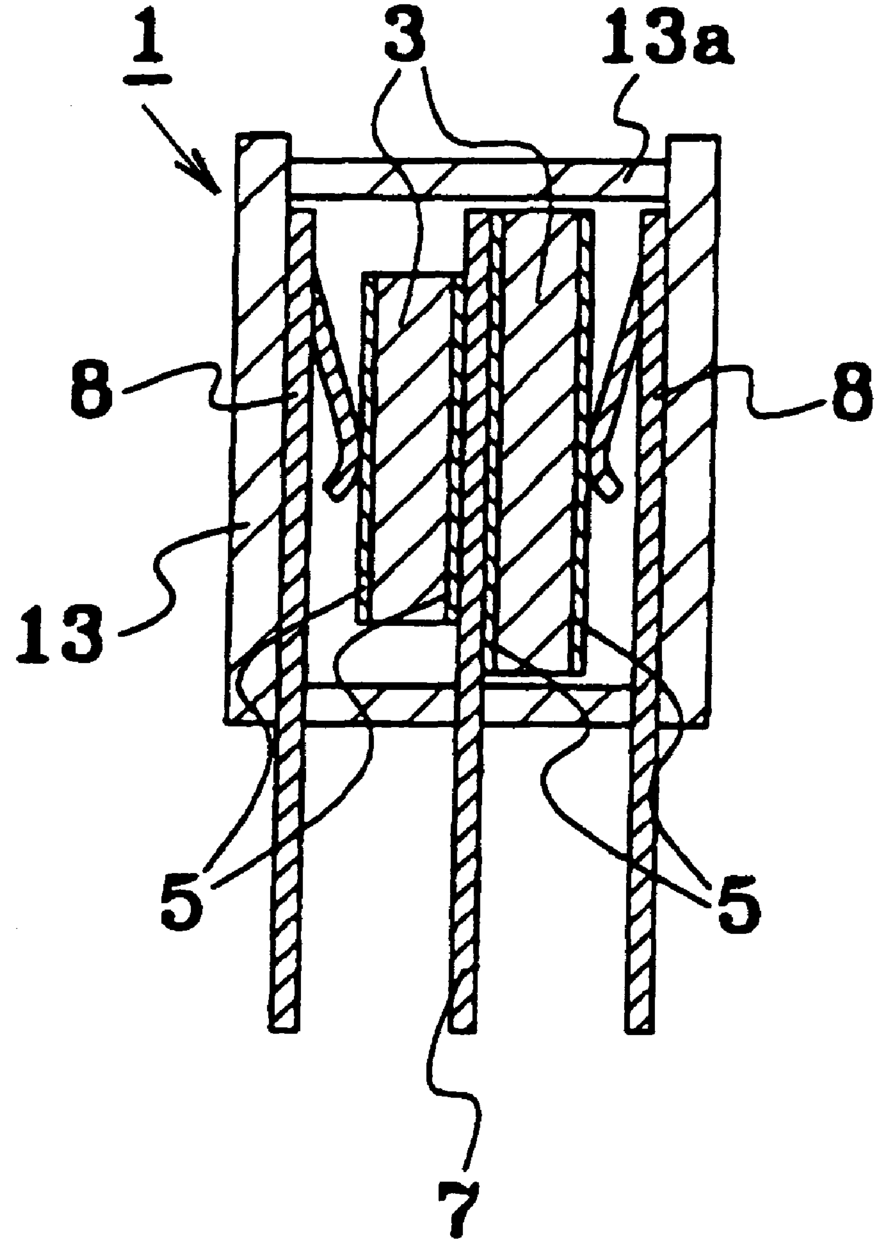
FIG. 3 is a schematic cross-sectional view of still another example electronic element fabricated from the semiconducting ceramic according to the present invention.

FIG. 3 shows still another example product of an electronic element fabricated from the semiconducting ceramic according to the present invention.

The semiconducting ceramic element 1 shown in FIG. 3 is of a dual laminate type, and comprises two-layered semiconducting ceramics 3, electrodes 5 formed on the semiconducting ceramics 3, a lead terminal 7 which is electrically connected with the innermost electrodes 5, spring terminals 8 which are electrically connected with the outermost electrodes 5, a casing body 13 which houses the above elements, and a lid 13*a* for the casing 13 body. Each of the electrodes 5 has a first layer of Ni and a second layer of Ag.

The above three types are mentioned only for the purposes of illustration, and numerous modifications and variations may be apparent to those having ordinary skill in the art within the spirit of the present invention.

As described hereinabove, the semiconducting ceramic according to the present invention comprises a semiconducting sintered barium titanate containing the following substances: boron oxide; an oxide of at least one metal selected from among barium, strontium, calcium, lead, yttrium and a rare earth element which is formed outside the Ba sites in $BaTiO_3$; and an optional oxide of at least one metal selected from among titanium, tin, zirconium, niobium, tungsten and antimony which is formed outside the Ti sites in $BaTiO_3$, the boron oxide being incorporated in an amount, reduced to atomic boron, satisfying the following relationships:

$$0.005 \leqq B/\beta \leqq 0.50 \text{ and}$$

$$1.0 \leqq B/(\alpha-\beta) \leqq 4.0$$

wherein α represents the total number of atoms of barium, strontium, calcium, lead, yttrium and rare earth element contained in the semiconducting ceramic, and β represents the total number of atoms of titanium, tin, zirconium, niobium, tungsten and antimony contained in the semiconducting ceramic. Therefore, the ceramic can become semiconducting even when fired at a temperature lower than 1000° C. In addition, by use of the semiconducting ceramic according to the present invention wherein the ratio of Ba to Ti is more than one and boron is added, there can be realized a prolonged service life of a furnace used for firing; reduced costs and work for maintaining the furnace; and a reduced energy consumption due to lowered firing temperature.

What is claimed is:

1. A semiconducting ceramic comprising a semiconducting sintered barium titanate containing boron oxide; an oxide of at least one metal selected from the group consisting of barium, strontium, calcium, lead, yttrium and rare earth element; and optionally an oxide of at least one metal selected from the group consisting of titanium, tin, zirconium, niobium, tungsten and antimony; the boron oxide being in an amount, as atomic boron, of $$0.005 \leqq B/\beta \leqq 0.50 \text{ and}$$

$$1.0 \leqq B/(\alpha-\beta) \leqq 4.0$$

wherein α represents the total number of atoms of barium, strontium, calcium, lead, yttrium and rare earth element in the semiconducting ceramic, and β represents the total number of atoms of titanium, tin, zirconium, niobium, tungsten and antimony in the semiconducting ceramic.

2. The electronic element comprising the semiconducting ceramic of claim 1 containing an oxide of Sm.

3. The electronic element comprising the semiconducting ceramic of claim 2 which does not contain said optional metal oxide.

4. The electronic element comprising the semiconducting ceramic of claim 1 containing an oxide of La.

5. The electronic element comprising the semiconducting ceramic of claim 1 containing an oxide of Nb.

6. The electronic element comprising the semiconducting ceramic of claim 1 containing an oxide of Dy.

7. The electronic element comprising the semiconducting ceramic of claim 1 containing an oxide of Ba.

8. The electronic element comprising the semiconducting ceramic of claim 1 containing an oxide of Y.

9. An electronic element comprising the semiconducting ceramic of claim 8 and at least one electrode.

10. An electronic element comprising the semiconducting ceramic of claim 1 and at least one electrode.

11. An electronic element comprising the semiconducting ceramic of claim 2 and at least one electrode.

12. An electronic element comprising the semiconducting ceramic of claim 3 and at least one electrode.

13. An electronic element comprising the semiconducting ceramic of claim 4 and at least one electrode.

14. An electronic element comprising the semiconducting ceramic of claim 5 and at least one electrode.

15. An electronic element comprising the semiconducting ceramic of claim 6 and at least one electrode.

16. An electronic element comprising the semiconducting ceramic of claim 7 and at least one electrode.

* * * * *